(12) United States Patent  (10) Patent No.: US 9,082,467 B2
Yun et al.  (45) Date of Patent: Jul. 14, 2015

(54) SUB WORD LINE DRIVER AND SEMICONDUCTOR INTEGRATED CIRCUIT DEVICE

(71) Applicant: SK hynix Inc., Icheon-si Gyeonggi-do (KR)

(72) Inventors: Tae Sik Yun, Icheon-si (KR); Dong Hwee Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/590,503

(22) Filed: Jan. 6, 2015

(65) Prior Publication Data

US 2015/0117079 A1  Apr. 30, 2015

Related U.S. Application Data

(62) Division of application No. 13/442,614, filed on Apr. 9, 2012, now Pat. No. 8,953,407.

(30) Foreign Application Priority Data

Dec. 15, 2011  (KR) ........................ 10-2011-0135701

(51) Int. Cl.
  *G11C 8/08*  (2006.01)
  *G11C 5/02*  (2006.01)
(52) U.S. Cl.
  CPC ... *G11C 8/08* (2013.01); *G11C 5/02* (2013.01)

(58) Field of Classification Search
  CPC ......................................................... G11C 8/08
  USPC .................................................... 365/230.06
  See application file for complete search history.

(56) References Cited

U.S. PATENT DOCUMENTS

| 5,943,289 | A | * | 8/1999 | Ahn et al. | 365/230.06 |
| 6,069,838 | A | * | 5/2000 | Jeong | 365/230.06 |
| 6,160,753 | A | * | 12/2000 | Shibayama | 365/230.06 |
| 7,773,447 | B2 | * | 8/2010 | Kajigaya | 365/230.03 |
| 8,737,157 | B2 | * | 5/2014 | Kim et al. | 365/230.06 |
| 2009/0238024 | A1 | * | 9/2009 | Kim et al. | 365/230.06 |
| 2011/0170344 | A1 | * | 7/2011 | Chae et al. | 365/182 |

* cited by examiner

*Primary Examiner* — Hoai V Ho
*Assistant Examiner* — Tri Hoang
(74) *Attorney, Agent, or Firm* — William Park & Associates Ltd.

(57) ABSTRACT

A sub word line driver and a semiconductor integrated circuit device having the same are provided. The semiconductor integrated circuit device includes adjacent four sub word line drivers configured to drive four sub word lines in response to signals of four main word lines, wherein first and second sub word line drivers of adjacent sub word line drivers share one keeper transistor with each other, and third and fourth sub word line drivers of the adjacent sub word line drivers share one keeper transistor with each other.

4 Claims, 10 Drawing Sheets

SUB WORD LINE DRIVER AND SEMICONDUCTOR INTEGRATED CIRCUIT DEVICE

CROSS-REFERENCES TO RELATED APPLICATION

The present application claims priority under 35 U.S.C. §119(a) to Korean application number 10-2011-0135701, filed on Dec. 15, 2011, in the Korean Intellectual Property Office, which is incorporated herein by reference in its entirety as set forth in full.

BACKGROUND

The present invention relates to a semiconductor integrated circuit technology, and more particularly, to a sub word line driver and a semiconductor integrated circuit device having the same.

A semiconductor memory device, particularly DRAM, is designed such that one main word line selectively activates one of a plurality of sub word lines. For example, when 64 main word lines exists and 8 sub word lines exist per main word line, one main word line activates one of the 8 sub word lines.

In order to control the sub word lines, a sub word line driver is disposed near a memory cell array. The sub word line driver is generally configured to include a CMOS inverter and a keeper transistor connected to an output terminal of the CMOS inverter. Here, the CMOS inverter receives a main word line signal, and the keeper transistor is used to prevent a problem caused by floating of non-selected sub word lines.

As the sub word line driver is configured to include the CMOS inverter and the keeper transistor composed of NMOS transistors as described above, the sub word line driver includes one PMOS transistor and two NMOS transistors. Therefore, the sub word line driver requires two wells disposed to be spaced apart from each other, and the two wells occupy a certain area.

As the integration density of a memory cell array of a semiconductor memory device is decreased, the area of a control circuit region is also decreased, and accordingly, it is required to decrease the area of the sub word line driver.

SUMMARY

In one embodiment of the present invention, a semiconductor integrated circuit device includes a plurality of main word lines, and a plurality of sub word lines configured to be driven in response to a signal of each of the plurality of main word lines. In the semiconductor integrated circuit device, the plurality of sub word lines are extended toward a cell array area from regions of sub word line drivers, respectively disposed at both edges of a cell array area, and one sub word line selected from a plurality of sub word lines extended from one region of the sub word line driver of the cell array area and another sub word line adjacent to the selected sub word line are driven in response to signals of main word lines which are differently operated, respectively.

In another embodiment of the present invention, a sub word line driver of a semiconductor integrated circuit device includes a semiconductor substrate configured to comprise an N-well having PMOS transistors formed therein and a P-well having NMOS transistors formed therein, four sub word lines configured to be extended in parallel over the N-well and P-well, first to fourth sub word line selection lines configured to be extended in a direction intersecting with the four sub word lines and formed on the N-well, a pair of VSS lines configured to be formed on the P-well and formed in parallel with the extended direction of the sub word lines, a first main word line configured to comprise a first part having two intersections with one two sub word line of the sub word line selection lines and a second part intersecting with the pair of the VSS lines, and a second main word line configured to comprise a first part having two intersections with an other two sub word line of the sub word line selection lines and a second part intersecting with the pair of the VSS lines.

In still another embodiment of the present invention, a sub word line driver of a semiconductor integrated circuit device includes a semiconductor substrate configured to comprise an N-well having PMOS transistors formed therein and a P-well having NMOS transistors formed therein, four sub word lines configured to be extended in parallel over the N-well and P-well, a sub word line selection line configured to be extended in a direction parallel with the four sub word lines, first and second VSS lines configured to be formed on the P-well, extended in a direction vertical to the extended direction of the sub word lines, and spaced apart from each other at a predetermined interval, a first main word line configured to comprise a pair of bar electrodes substantially intersecting with the four sub word lines and a branch electrode intersecting with the first VSS line, a second main word line configured to comprise a pair of bar electrodes substantially intersecting with the four sub word lines and a branch electrode intersecting with the second VSS line, a third main word line configured to comprise a pair of bar electrodes substantially intersecting with the four sub word lines and a branch electrode intersecting with the first VSS line, and a fourth main word line configured to comprise a pair of bar electrodes substantially intersecting with the four sub word lines and a branch electrode intersecting with the second VSS line. In the sub word line driver, the sub word line driver further comprises a first keeper transistor positioned between the branch electrodes of the first and third main word lines and a second keeper transistor positioned between the branch electrodes of the second and fourth main word lines.

In still another embodiment of the present invention, a semiconductor integrated circuit device includes a plurality of sub word line drivers configured to drive sub word lines in response to signal of main word lines. In the semiconductor integrated circuit device, adjacent sub-word line drivers respectively drive the sub word lines in response to main word line signals which have different logic levels so as to eliminate a keeper transistor.

In still another embodiment of the present invention, a semiconductor integrated circuit device includes adjacent four sub word line drivers configured to drive four sub word lines in response to signals of four main word lines. In the semiconductor integrated circuit device, first and second sub word line drivers of the adjacent sub word line drivers share one keeper transistor with each other, and third and fourth sub word line drivers of the adjacent sub word line drivers share one keeper transistor with each other.

BRIEF DESCRIPTION OF THE DRAWINGS

Features, aspects, and embodiments are described in conjunction with the attached drawings, in which.

DETAILED DESCRIPTION

Hereinafter, a sub word line driver and a semiconductor integrated circuit device according to an embodiment of the present invention will be described below with reference to the accompanying drawings through example embodiments.

Figure 1:
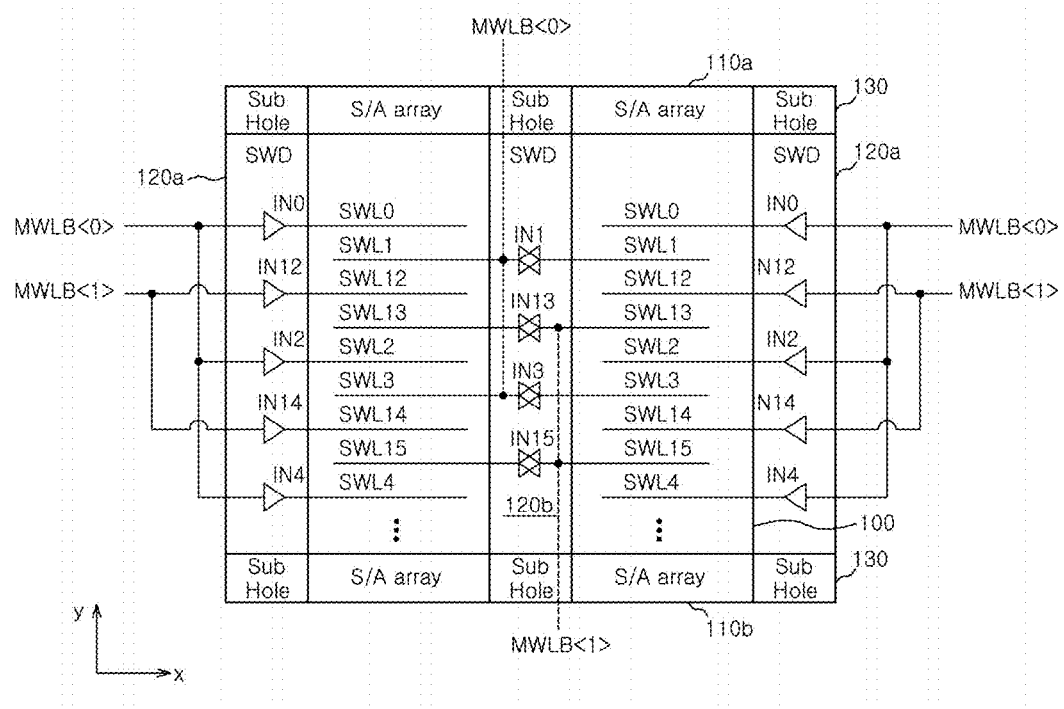
FIG. 1 is a block diagram of a semiconductor integrated circuit device, illustrating a method of arranging sub word lines according to one embodiment.

FIG. 1 is a schematic diagram of a semiconductor integrated circuit device, illustrating a method of arranging sub word lines according to one embodiment. In this embodiment, a technology for removing a keeper transistor by changing an order of the sub word lines will be described.

The semiconductor integrated circuit device includes, as illustrated in FIG. 1, a cell array area 100, sense amplifier array regions (S/A array) 110a and 110b, sub word line driver regions (SWD) 120a and 120b, and sub holes 130.

The cell array area 100 includes a plurality of sub word lines (hereinafter, referred to as SWLs) arranged along a direction of an x-axis in the figure while having a certain rule at an upper part thereof.

The sense amplifier array regions 110a and 110b are disposed at edges of the x-axis of the cell array area 100, respectively, and the sub word line driver regions 120a and 120b are disposed at edges of y-axis of the cell array area 100, respectively. The sub holes 130 are respectively positioned at intersection portions of the sense amplifier array regions 110a and 110b and the sub word line driver regions 120a and 120b.

Generally, the SWLs are sequentially arranged on the cell array area 100. For example, SWL0 to SWL15 are consecutively arranged in sequence. In addition, the SWLs are configured so that a same main word line controls SWLs consecutively arranged for each group. For example, the SWL0 to SWL7 are controlled by a first main word line, and the SWL8 to SWL15 is controlled by a second main word line.

However, in this embodiment, the SWLs are arranged so that adjacent SWLs are controlled by main word lines which are differently operated, respectively.

An arrangement of SWL0 to SWL15 driven using a 1:8 coding scheme will be described as an example. As illustrated in FIG. 1, the SWL0, SWL12, SWL2, SWL14, SWL4, SWL8, SWL6 and SWL10 can be sequentially extended toward the cell array 100 from one sub word line driver region 120a, and the SWL1, SWL13, SWL3, SWL15, SWL5, SWL9, SWL7 and SWL11 can be sequentially extended toward the cell array 100 from the other sub word line driver region 120b. Here, the SWL1 can be disposed between the SWL0 and SWL12, and the SWL13 can be disposed between the SWL12 and SWL2. The SWL3 can be disposed between the SWL2 and SWL14, and SWL15 may be disposed at an outside of the SWL14. Although each of the SWL0 and SWL1, SWL13 and SWL12, SWL2 and SWL3, and SWL14 and SWL15 are consecutively numbered, they are designed to be connected to main word line drivers which are differently operated, respectively.

Figure 2:
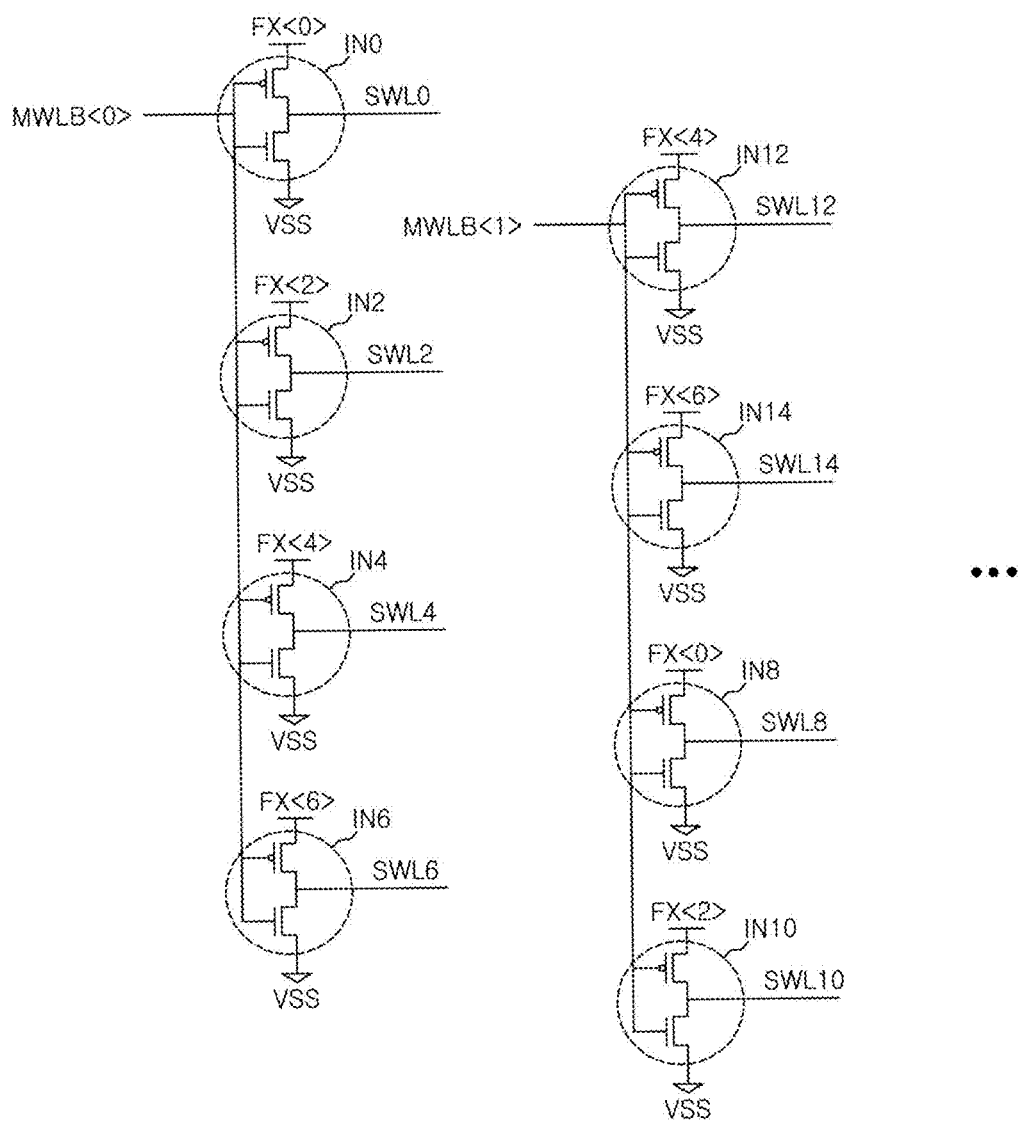
FIG. 2 is an internal circuit diagram of a sub word line driver region of FIG. 1.

As illustrated in FIG. 2, the SWL0, SWL2, SWL4 and SWL6 arranged to be spaced part from one another are respectively driven by operations of first, third, fifth and seventh drivers IN0, IN2, IN4 and IN6 configured as CMOS inverters, in response to a first main word line signal MWLB<0> provided from a first main word line driver (not shown).

In this case, a first sub word line selection signal FX<0> can be provided as a driving voltage of the first driver IN0, and a third sub word line selection signal FX<2> can be provided as a driving voltage of the third driver IN2. A fifth sub word line selection signal FX<4> can be provided as a driving voltage of the fifth driver IN4, and a seventh sub word line selection signal FX<6> can be provided as a driving voltage of the seventh driver IN6.

Meanwhile, the SWL8, SWL10, SWL12 and SWL14 connected to a second main word line driver (not shown) are arranged in the order of the SWL12, SWL14, SWL8 and SWL10 so that adjacent SWLs can be controlled by different main word line drivers, respectively. The SWL12, SWL14, SWL8 and SWL10 are respectively driven by operations of a thirteenth, fifteenth, ninth and eleventh drivers IN12, IN14, IN8 and IN10, in response to a second main word line signal MWLB<1> provided form the second main word line driver (not shown). Here, the different main word line drivers may interpreter main word drivers which are activated at different timings. For example, if the selected main word line driver outputs a signal having a High level, as the main word line signal, the main word line driver which is connected with the adjacent SWL outputs a signal having a Low level, as the main word line signal.

In this case, the fifth sub word line selection signal FX<4> is provided as a driving voltage of the thirteenth driver IN12, and the seventh sub word line selection signal FX<6> is provided as a driving voltage of the fifteenth driver IN14. The first sub word line selection signal FX<0> is provided as a driving voltage of the ninth driver IN8, and the third sub word line selection signal FX<2> is provided as a driving voltage of the eleventh driver IN10.

Although the structure of some of the sub word line drivers in one sub word line driver region has been described in FIG. 2, the rule described above can be identically applied to the structure of the sub word line drivers in the other sub word line driver region.

Figure 3:
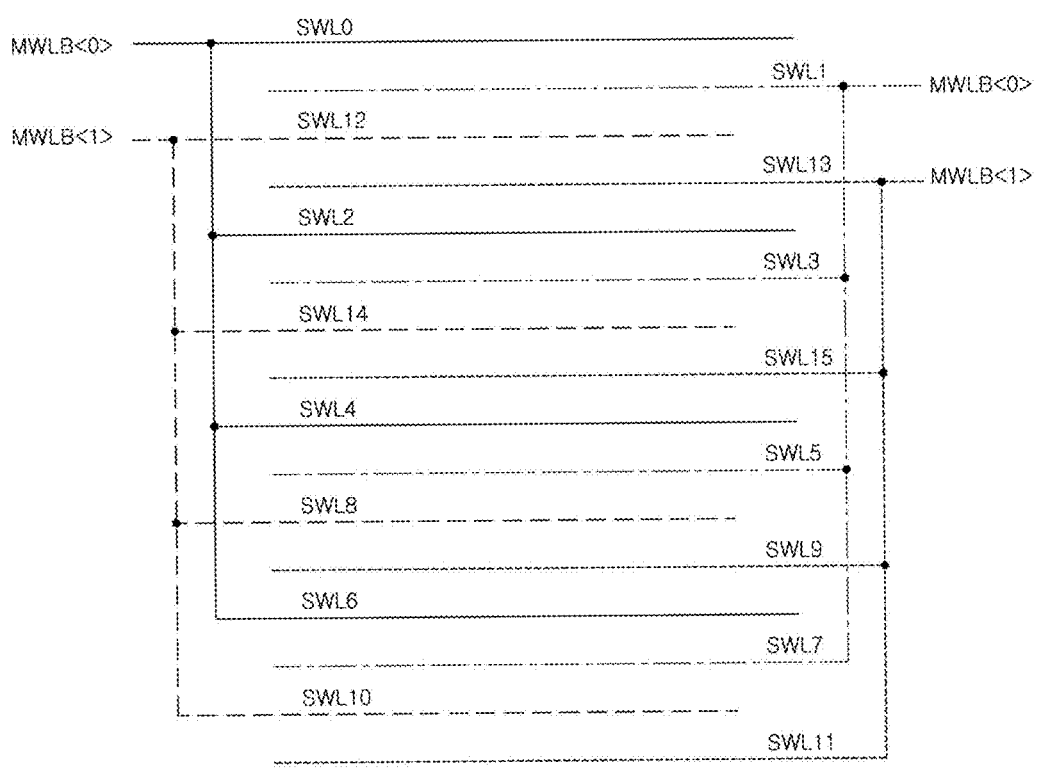
FIG. 3 is a diagram schematically illustrating an arrangement of the sub word lines according to an embodiment.

As illustrated in FIG. 3, in the SWLs arranged on the cell array area 100, SWLs respectively responding to the first, second, third and fourth main word line signals MWLB<0>, MWLB<1>, MWLB<2> and MWLB<3> can be sequentially arranged. FIG. 3 is merely provided as an example of this embodiment, and all arrangements having the rule described above can be included in the scope of the present invention.

If adjacent SWLs are driven by the main word line drivers which are activated at different timings, respectively, the function of the related art keeper transistor is insignificant. That is, the related art keeper transistor was provided to prevent floating of SWLs. However, in this embodiment, when adjacent SWLs are controlled by main word lines having different logic levels, respectively, such a problem does not substantially occur. For example, an aspect of this embodiment is similar to a phenomenon that a voltage level of a word line which is adjacent with an active word line and share with a bit line contact is increased, than the threshold voltage of a transistor connected with the word line which is adjacent with the active word line and share with the bit line contact is lowered.

When the SWLs are arranged as described in this embodiment, the keeper transistor can be omitted.

Figure 4:
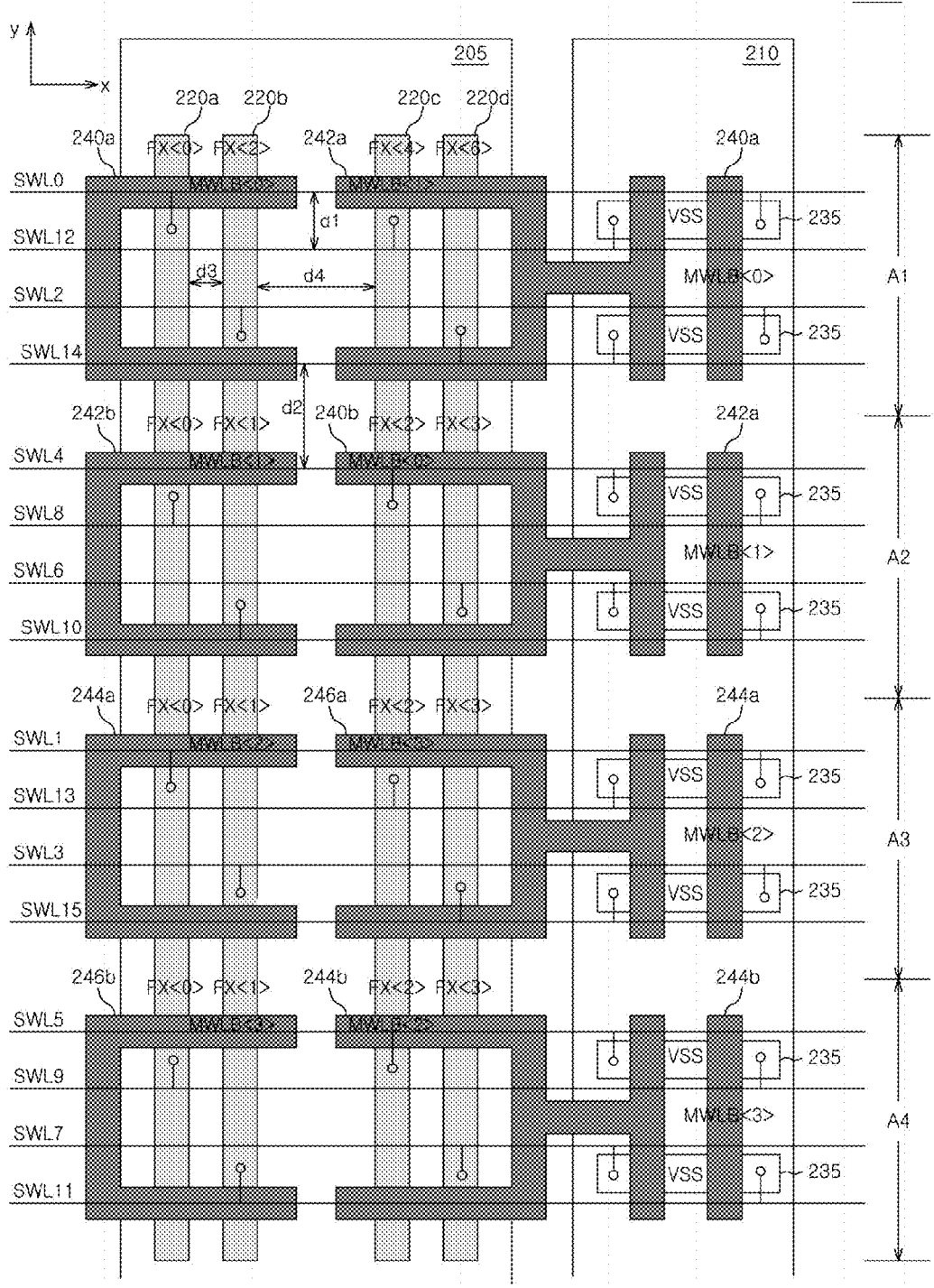
FIGS. 4 and 5 are layout diagrams of a sub word line driver according to an embodiment.

A layout structure of the sub word line drivers, in which the keeper transistor is omitted through the arrangement of the SWLs according to this embodiment, is illustrated in FIG. 4.

Referring to FIG. 4, an N-well 205 and a P-well 210 are extended in a direction of an x-axis on a semiconductor substrate 200 defined as the sub-word line driver regions 120a and 120b. The N-well 205 has a predetermined line width and corresponds to a PMOS transistor region. The P-well 210 has a predetermined line width and corresponds to an NMOS transistor region. In this embodiment, the line width of the N-well 205 is designed to be more than two times wider than that of the P-well 210. That is, since the keeper transistor configured as an NMOS transistor is omitted in this embodiment, the line width of the P-well 210 that is the NMOS transistor region is designed to be ½ or less than that of the N-well 205.

A plurality of SWLs can be extended to the x-axis of FIG. 4 on the N-well 205 and P-well 210 based on the rule of FIG. 3.

First, the SWL0, SWL12, SWL2 and SWL14 controlled by the first and second main word line signal MWLB<0> and MWLB<1> are arranged at a first interval d1 on first sections A1 of the N-well 205 and P-well 210.

The SWL4, SWL8, SWL6 and SWL10 controlled by the first and second word line signal MWLB<0> and MWLB<1>, are arranged at the first interval d1 on second sections A2 of the N-well 205 and P-well 210. In this case, the SWL14 and SWL4 are arranged at a second interval d2 greater than the first interval d1.

The SWL1, SWL13, SWL3 and SWL15 controlled by the third and fourth main word line signal MWLB<2> and MWLB<3>, are arranged at the first interval d1 on third sections A3 of the N-well 205 and P-well 210. In this case, the SWL10 and SWL1 are spaced apart from each other at the second interval d2.

The SWL5, SWL9, SWL7 and SWL11 controlled by the third and fourth main word line signal MWLB<2> and MWLB<3>, are arranged at the first interval d1 on fourth sections A3 of the N-well 205 and P-well 210. In this case, the SWL15 and SWL5 are spaced apart from each other at the second interval d2.

Here, the first to fourth sections A1 to A4 are areas arranged adjacent to one another along a direction of the y-axis in the FIG. 4. The first to fourth sections A1 to A4 are areas arbitrarily partitioned for convenience of illustration in this embodiment, and the areas of the first to fourth sections A1 to A4 can be substantially similar to one another.

First to fourth sub word line selection signal lines 220a, 220b, 220c and 220d are arranged on the N-well 205 so as to extend substantially vertical to the plurality of SWLs along the direction of the y-axis in FIG. 4. In this case, each of the first and second sub word line selection signal lines 220a and 220b and the third and fourth sub word line selection signal lines 220c and 220d can be spaced apart at a third interval d3, and the second and third sub word line selection signal lines 220b and 220c can be spaced apart at a fourth interval d4 greater than the third interval d3. Although not illustrated in detail in this figure, each of the first to fourth sub word line selection signal lines 220a, 220b, 220c and 220d can have the shape of a line or junction area, which is electrically connected to a source part (corresponding to the N-well) of the PMOS transistor constituting each of the sub word line drivers.

VSS lines 235 are disposed at predetermined positions on the P-well 210. The VSS lines 235 are respectively disposed between the first and second SWLs and between the third and fourth SWLs in each of the sections A1 to A4. The VSS line 235 can be disposed in the shape of a line parallel with the SWL, and the line width W of the VSS line 235 can be substantially identical to or slightly smaller than the first interval d1. Although not illustrated in detail in this figure, the VSS line 235 can have the shape of a line or junction area, which is electrically connected to a source part (corresponding to the P-well) of the NMOS transistor constituting each of the sub word line drivers.

First and second main word lines 240a, 240b, 242a and 242b are disposed in predetermined shapes on the first and second sections A1 and A2, and third and fourth main word lines 244a, 244b, 246a and 246b are disposed at predetermined shapes on the third and fourth sections A3 and A4.

The first main word lines 240a on the first section A1 are formed to be separated on the N-well 205 and P-well 210, respectively. The first main word line 240a on the N-well 205 includes two parts respectively intersecting with the first and second sub word line selection signal lines 220a and 220b, and the two parts are electrically connected to each other. The main word line 240a on the P-well 210 is disposed in the shape of a single line on the first section A1 so as to intersect with all the SWL0, SWL12, SWL2 and SWL14 arranged on the first section A1. The second main word line 242a can be disposed on both the N-well 205 and P-well 210 without separation. The second main word line 242a includes two parts respectively intersecting with the third and fourth sub word line selection signal lines 220c and 220d on the N-well 205 and one part intersecting with the VSS line 235 on the P-well 210, and the parts are electrically connected to one another. Here, the first main word line 240a can be electrically related to the SWL0 and SWL2, and the second main word line 242a can be electrically related to the SWL12 and SWL14.

The shapes of the main word lines disposed on the second section A2 are similar to those of the main word lines disposed on the first section A1. However, the second main word line 242b on the second section A2 is formed in a shape substantially similar to that of the first main word line 240a on the first section A1, and the first main word line 240b on the second section A2 is formed in a shape substantially similar to that of the second main word line 242a on the first section A1. In this case, the first main word line 240b can be electrically related to the SWL4 and SWL6, and the second main word line 242b can be electrically related to the SWL8 and SWL10.

Similarly, the shapes of the main word lines disposed on the third and fourth sections A3 and A4 can be substantially similar to those of the main word lines disposed on the first and second sections A1 and A2. The third main word line 244a on the third section A3 is formed in a shape substantially similar to that of the first main word line 240a on the first section A1, and the fourth main word line 246a on the third section A3 is formed in a shape substantially similar to that of the second main word line 242a on the first section A1. Here, the third main word line 244a can be electrically related to the SWL1 and SWL3, and the fourth main word line 246a can be related to the SWL13 and SWL15.

The third main word line 244b on the fourth section A4 is formed in a shape substantially similar to that of the first main word line 240b on the second section A2, and the fourth main word line 246b is formed in a shape substantially similar to that of the second main word line 242b on the section A2. Here, the third main word line 244b can be electrically related to the SWL5 and SWL7, and the fourth main word line 246b can be electrically related to the SWL9 and SWL11.

Figure 5:
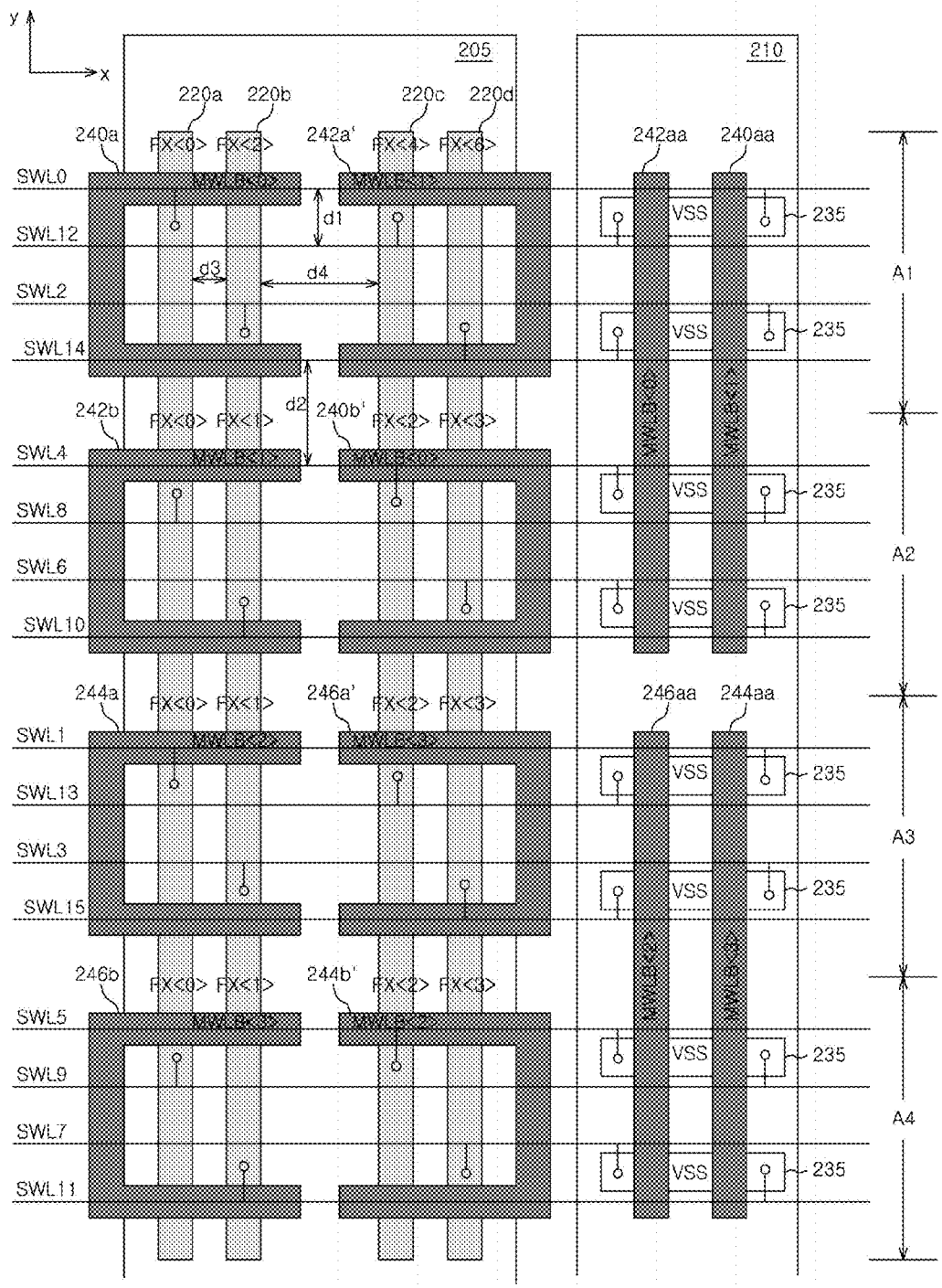

As illustrated in FIG. 5, the first to fourth main word lines 242a, 240b, 246a and 244b are integrally disposed at a boundary part between the N-well 205 and P-well 210 can be separated into main word lines 242a', 240b', 246a' and 244b' on the N-well 205 and main word lines 242aa and 246aa on the P-well 210. In this case, first and second main word lines 240aa and 242aa can be disposed vertical to the SWLs without separation on the first and second sections A1 and A2, and third and fourth main word lines 244aa and 246aa can be disposed vertical to the SWLs without separation on the third and fourth sections A3 and A4.

According to this embodiment, the sub word line driver is configured so that adjacent SWLs are respectively controlled by different main word lines by changing the arrangement order of SWLs, thereby eliminating a keeper transistor. Thus, the area of the sub word line driver is decreased by the area of the keeper transistor, so that the area of the semiconductor integrated circuit device can be decreased.

Figure 6:
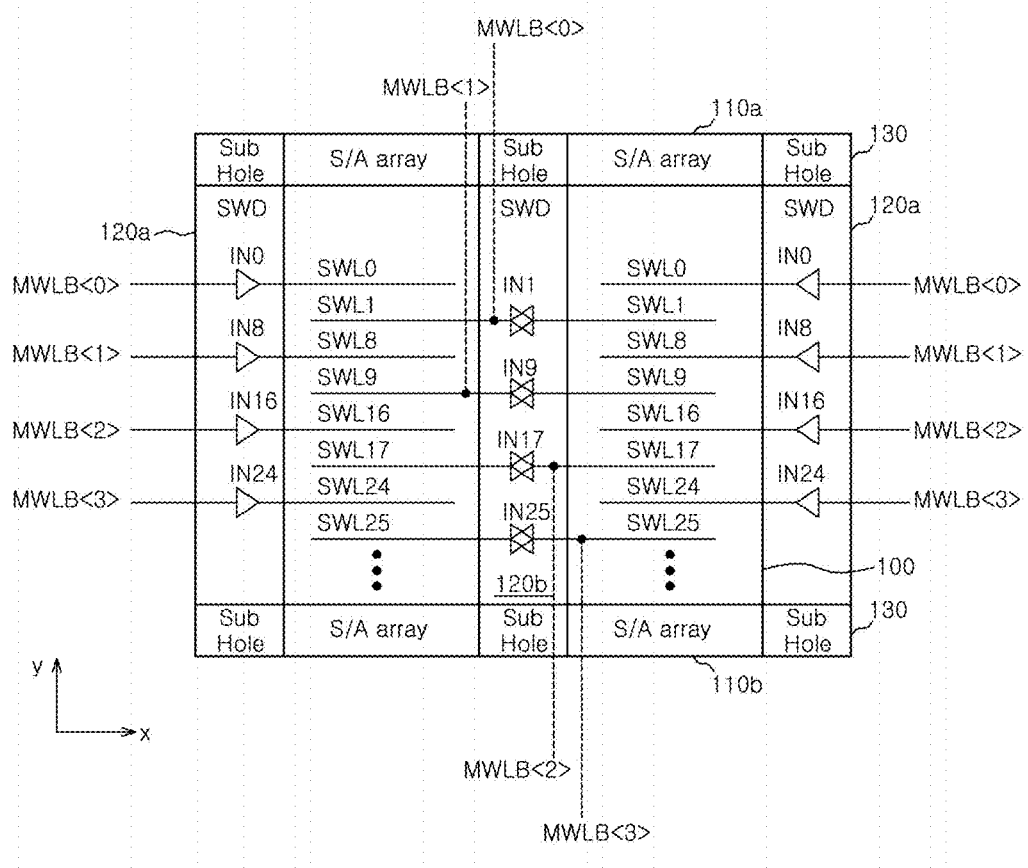
FIG. 6 is a block diagram of a semiconductor integrated circuit device, illustrating a method of arranging sub word lines according to another embodiment.

FIG. 6 is a block diagram of a semiconductor integrated circuit device, illustrating a method of arranging sub word lines according to another embodiment.

The basic configuration of the semiconductor integrated circuit device of this embodiment is substantially similar to that of the semiconductor integrated circuit device of the aforementioned embodiment, but only the order of the SWLs arranged on the cell array area 100 in this embodiment is different from that the SWLs arranged on the cell array area 100 in the aforementioned embodiment. In this embodiment, the semiconductor integrated circuit device has a structure in which two sub word lines share one keeper transistor due to a change in the order of the SWLs.

Referring to FIG. 6, the SWL0, SWL8, SWL16, SWL24, SWL2, SWL10, . . . are sequentially arranged to extend toward the cell array area 100 from one sub word line driver region 120a, and the SWL1, SWL9, SWL17, SWL26, SWL3, . . . are sequentially arranged to extend toward the cell array area 100 from the other sub word line driver region 120b.

The arrangement rule of the SWLs will be described in detail with reference to FIG. 7. First, it is assumed that four main word lines are provided, the SWL0 to SWL7 are controlled by the first main word line signal MWLB<0>, the SWL8 to SWL15 are controlled by the second main word line signal MWLB<1>, the SWL16 to SWL23 are controlled by the third main word line signal MWLB<2>, and the SWL24 to SWL31 are controlled by the fourth main word line signal MWLB<3>. Under the assumption described above, SWL respectively controlled by different main word line signals are arranged adjacent to each other in each of the sub word line driver regions 120a and 120b.

In view of the one sub word line driver region 120a, the SWLs are arranged in the order of the SWL0 responding to the first main word line signal MWLB<0>, the SWL8 responding to the second main word line signal MWLB<1>, the SWL16 responding to the third main word line signal MWLB<2>, the SWL24 responding to the fourth main word line signal MWLB<3>, the SWL2 responding to the first main word line signal MWLB<0>, the SWL10 responding to the second main word line signal MWLB<1>, the SWL18 responding to the third main word line signal MWLB<2>, the SWL26 responding to the fourth main word line signal MWLB<3>, the SWL4 responding to the first main word line signal MWLB<0>, . . . .

In view of the other sub word line driver region 120b, the SWLs are arranged in the order of the SWL1 responding to the first main word line signal MWLB<0>, the SWL9 responding to the second main word line signal MWLB<1>, the SWL17 responding to the third main word line signal MWLB<2>, the SWL25 responding to the fourth main word line signal MWLB<3>, the SWL3 responding to the first main word line signal MWLB<0>, the SWL11 responding to the second main word line signal MWLB<1>, the SWL19 responding to the third main word line signal MWLB<2>, the SWL27 responding to the fourth main word line signal MWLB<3>, the SWL5 responding to the first main word line signal MWLB<0>, . . . . In this case, the SWLs extended from the other sub word line driver region 120b are positioned between pairs of the SWLs extended from the one sub word line driver region 120a, respectively.

Although the SWLs respectively controlled by different main word line signals are extended from one of the sub word line driver regions 120a and 120b, one SWL (x) of adjacent two SWLs with respect to one SWL (o) is controlled by the same main word line signal as the SWL (o) due to the folded symmetric arrangement of the SWLs. Therefore, a floating problem can be still induced.

Accordingly, in this embodiment, a keeper transistor is disposed between adjacent SWLs extended from the same sub word line driver region 120a or 120b and respectively controlled by the first and second main word line signals MWLB<0> and MWLB<1>, and a keeper transistor is disposed between adjacent SWLs extended from the same sub word line driver region 120a or 120b and respectively controlled by the third and fourth main word line signals MWLB<2> and MWLB<3>. That is, the keeper transistors are disposed between the first and second SWLs and between the third and fourth SWLs, respectively.

Figure 8:
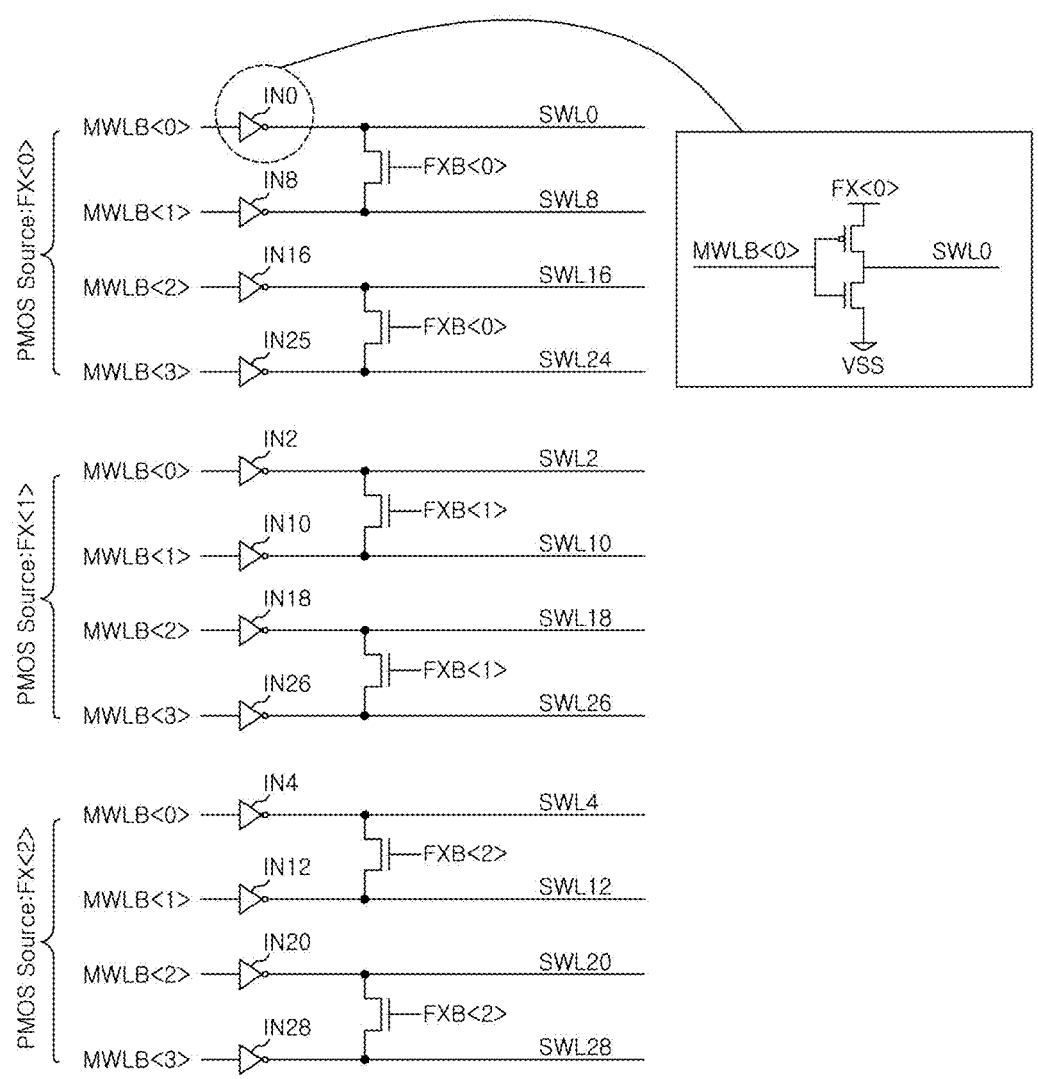
FIG. 8 is an internal circuit diagram of a sub word line driver region.

FIG. 8 is a circuit diagram schematically illustrating a configuration of the one sub word line driver region 120a according to this embodiment.

Referring to FIG. 8, a first driver IN0 driving the SWL0 in response to the first main word line signal MWLB<0>, a ninth driver IN8 driving the SWL8 in response to the second main word line signal MWLB<1>, a seventeenth driver IN16 driving the SWL16 in response to the third main word line signal MWLB<2> and a twenty fifth driver IN24 driving the SWL24 in response to the fourth main word line signal MWLB<3> are formed in the sub word line driver region 120a. Each of the first, ninth, seventeenth and twenty fifth drivers IN0, IN8, IN16 and IN24 can have a CMOS inverter structure, and a first sub word line selection signal FX<0> is inputted to a PMOS source of each of the drivers.

Also, a third driver IN2 driving the SWL2 in response to the first main word line signal MWLB<O>, an eleventh driver IN10 driving the SWL10 in response to the second main word line signal MWLB<1>, a nineteenth driver IN18 driving the SWL18 in response to the third main word line signal MWLB<2> and a twenty seventh driver IN26 driving the SWL26 in response to the fourth main word line signal MWLB<3> are formed in the sub word line driver region 120a. Each of the third, eleventh, nineteenth and twenty seventh drivers IN2, IN10, IN18 and IN26 can have the CMOS inverter structure, and a second sub word line selection signal FX<1> is inputted to a PMOS source of each of the drivers.

Under the rule described above, the four SWLs controlled by the first to fourth main word line signals MWLB<0:3> are arranged to receive the same sub word line selection signal.

Accordingly, although floating of a SWL occurs under the driving of the same main word line signal, a problem caused by the floating can be solved by the keeper transistor connected between the SWL and an SWL adjacent thereto.

The related art keeper transistor was designed so that one keeper transistor is connected to one SWL. However, in this embodiment, the keeper transistor can be designed so that two SWLs share one keeper transistor with each other. Thus, the area of the keeper transistor can be decreased to ½ of that of the related art keeper transistor.

Figure 9:
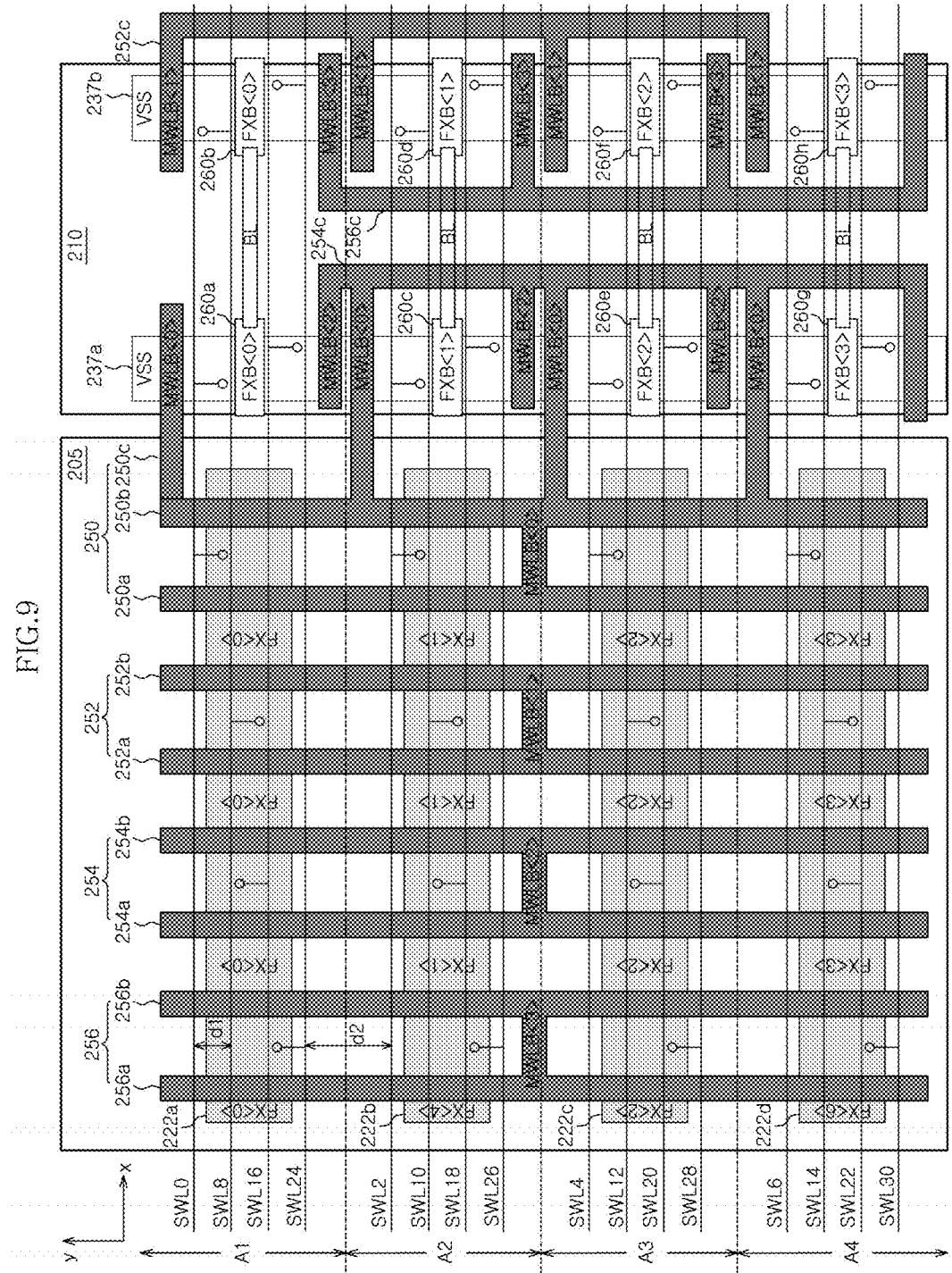
FIGS. 9 and 10 are layout diagrams of a sub word line driver according to an embodiment.

FIG. 9 illustrates a layout structure of the sub word line driver region according to this embodiment.

Referring to FIG. 9, an N-well 205 having PMOS transistors formed therein and a P-well 210 having NMOS transistors formed therein are formed in the sub word line driver region 120a. Each of the N-well 205 and P-well 210 has a predetermined line width, and is extended in the direction of y-axis.

Figure 7:
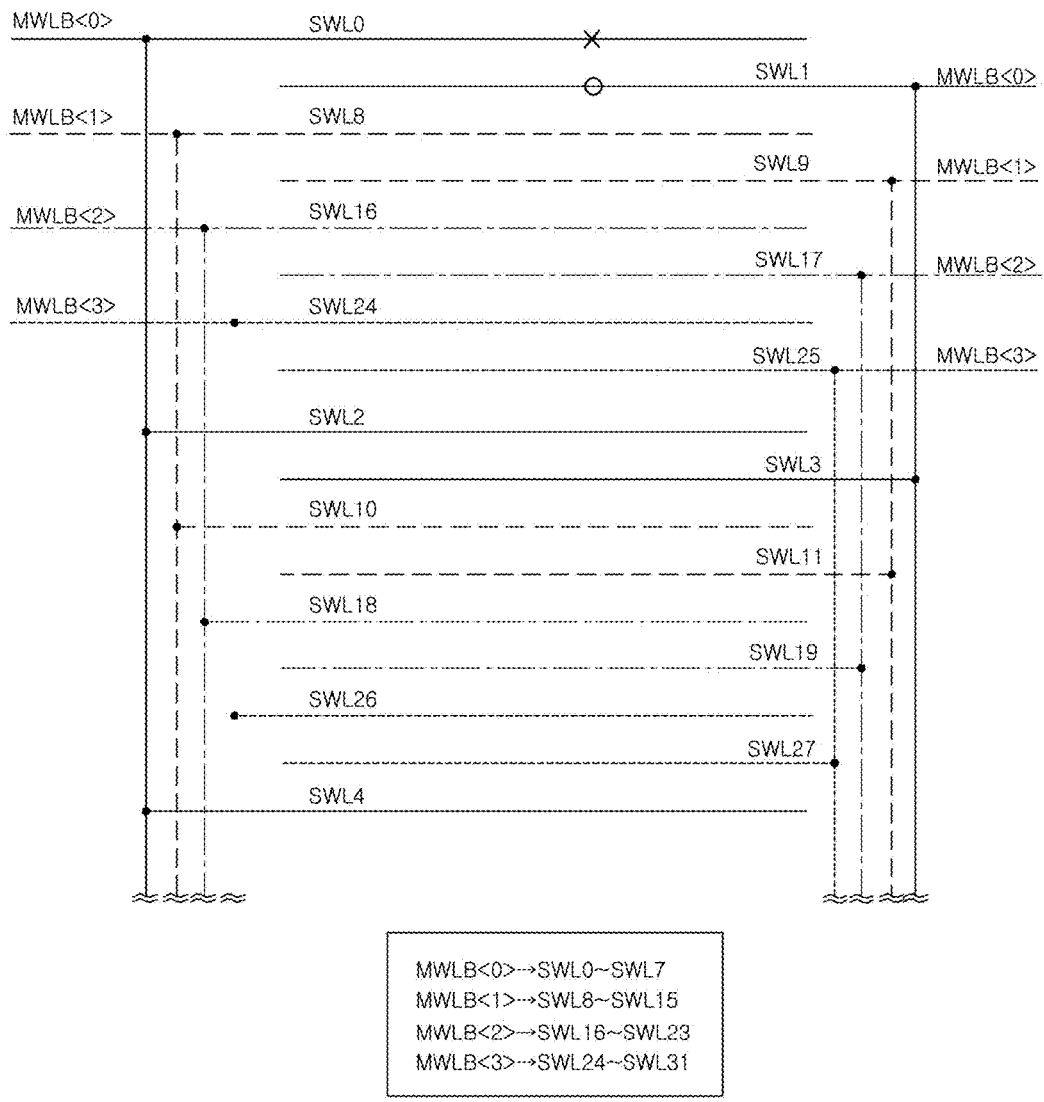
FIG. 7 is a diagram schematically illustrating an arrangement of the sub word lines according to an embodiment.

The plurality of SWLs are arranged to extend in the direction of x-axis on the N-well 205 and P-well 210 according to the rule of FIGS. 7 and 8.

The SWL0, SWL8, SWL16 and SWL24 are disposed at a first interval d1 on first sections A1 of the N-well 205 and P-well 210.

The SWL2, SWL10, SWL18 and SWL26 are disposed at the first interval d1 on second sections A2 of the N-well 205 and P-well 210. In this case, the SWL24 and SWL2 are disposed at a second interval d2 greater than the first interval d1.

The SWL4, SWL12, SWL20 and SWL28 are disposed at the first interval d1 on third sections A3 of the N-well 205 and P-well 210. In this case, the SWL26 and the SWL4 are spaced apart from each other at the second interval d2.

The SWL6, SWL14, SWL22 and SWL30 are disposed at the first interval d1 on fourth sections A4 of the N-well 205 and P-well 210. In this case, the SWL28 and the SWL6 are spaced apart from each other at the second interval d2.

In this embodiment, the first to fourth sections A1 to A4 are areas arranged adjacent to one another along the direction of the y-axis. The first to fourth sections A1 to A4 are areas arbitrarily partitioned for convenience of illustration in this embodiment, and the areas of the first to fourth sections A1 to A4 can be substantially similar to one another.

A first sub word line selection signal line 222a is disposed on the N-well 205 of the first section A1, and a second sub word line selection line 222b is disposed on the N-well 205 of the second section A2. A third sub word line selection signal line 222c is disposed on the N-well 205 of the third section A3, and a fourth sub word line selection line 222d is disposed on the N-well 205 of the fourth section A4. Each of the sub word line selection signal lines 222a to 222d has a predetermined line width, e.g., a line width similar to that between the first and fourth SWLs positioned in one of the sections A1 to A4, and is formed to extend in the direction of the x-axis in FIG. 9.

Although not illustrated in detail in this figure, each of the first to fourth sub word line selection signal lines 220a, 220b, 220c and 220d can be electrically connected to a source part (corresponding to the N-well) of the PMOS transistor constituting each of the sub word line drivers. Each of the first to fourth sub word line selection signal lines 220a, 220b, 220c and 220d can have the shape of a line or junction area.

First and second VSS lines 237a and 237b extended in parallel with each other are disposed on the P-well 210. Each of the first and second VSS lines 237a and 237b has a predetermined line width, and can be extended in the direction of the y-axis without separation. Although not illustrated in detail in this figure, each of the first and second VSS lines 237a and 237b can be electrically connected to a source (corresponding to the P-well) of the NMOS transistor constituting each of the sub word line drivers. Here, each of the first and second VSS lines 237a and 237b can have the shape of a line or junction area.

First to fourth main word lines MWLB<0:3> are arranged on the N-well 205 and P-well 210.

The first main word line 250 (MWLB<0>) includes first and second bar electrodes 250a and 250b disposed to intersect with the plurality of the SWLs arranged on the N-well 205, and a plurality of branch electrodes 250c branched to intersect with the first VSS line 237a on the P-well 210 from the second bar electrode 250b. The first and second bar electrodes 250a and 250b and the branch electrodes 250c are connected to one another so that a signal is not blocked therein. The branch electrodes 250c can be branched in the first to fourth sections, respectively. The first main word line 250 can be electrically connected to each of the SWL0 to SWL7.

The second main word line 252 (MWLB<1>) includes first and second bar electrodes 252a and 252b disposed to intersect with the plurality of SWLs arranged on the N-well 205, and a plurality of branch electrode 252c disposed to intersect with the second VSS line 237b. The first and second bar electrodes 252a and 252b are electrically connected to each other. The first and second bar electrodes 252a and 252b are disposed adjacent to the first main word line 250, and one ends of the plurality of branch electrodes 252c are electrically connected to one another. Although the first and second bar electrodes 252a and 252b are spaced apart from the plurality of branch electrodes 252c, the same word line signal is inputted to the first and second bar electrodes 252a and 252b and the plurality of branch electrodes 252c. Here, the plurality of branch electrodes 252c are extended so that each of the plurality of branch electrodes 252c is overlapped with the second VSS line 237b in each of the first to fourth sections A1 to A4. In this case, the branch electrode 250c of the first main word line 250 and the branch electrode 252c of the second main word line 252 can be disposed symmetric with each other. For example, the branch electrode 252c can be disposed adjacent to an upper boundary of upper and lower boundaries between the sections.

The third main word line 254 (MWLB<2>) includes first and second bar electrodes 254a and 254b disposed to intersect with the plurality of SWLs arranged on the N-well 205, and a plurality of branch electrode 254c disposed to intersect with the first VSS line 237a. The first and second bar electrodes 252a and 252b are electrically connected to each other, and one ends of the plurality of branch electrodes 254c are electrically connected to one another. Although the first and second bar electrodes 254a and 254b are spaced apart from the plurality of branch electrodes 254c, the same word line signal is inputted to the first and second bar electrodes 254a and 254b and the plurality of branch electrodes 254c. Here, the plurality of branch electrodes 254c are extended so that each of the plurality of branch electrodes 254c is overlapped with the first VSS line 237a in each of the first to fourth sections A1 to A4. The branch electrode 254c can be disposed adjacent to the lower boundary of the upper and lower boundaries between the sections.

The fourth main word line 256 (MWLB<3>) includes first and second bar electrodes 256a and 256b disposed to intersect with the plurality of SWLs arranged on the N-well 205, and a plurality of branch electrode 256c disposed to intersect with the second VSS line 237b. The first and second bar electrodes 256a and 256b are electrically connected to each other and one ends of the plurality of branch electrodes 256c are electrically connected to one another. Although the first and second bar electrodes 256a and 256b are spaced apart from the plurality of branch electrodes 256c, the same word line signal is inputted to the first and second bar electrodes 256a and 256b and the plurality of branch electrodes 256c. Here, the plurality of branch electrodes 256c are extended so that each of the plurality of branch electrodes 256c is overlapped with the second VSS line 237b in each of the first to fourth sections A1 to A4. In this case, the branch electrode 254c of the third main word line 254 and the branch electrode 256c of the fourth main word line 256 can be disposed symmetric with each other. For example, the branch electrode 256c can be disposed adjacent to the lower boundary of the upper and lower boundaries between the sections.

A gate electrode 260a of a first keeper transistor, through which a first sub word line selection signal bar signal FXB<0> is provided to the first keeper transistor, is disposed on the first VSS line 237a between the branch electrode 250c of the first main word line 250 and the branch electrode 254c of the third main word line 254 in the first section A1. The first keeper transistor is connected between the SWL0 and SWL8. A gate electrode 260b of a second keeper transistor, through which the first sub word line selection signal bar signal FXB<0> is provided to the second keeper transistor, is disposed on the second VSS line 237b between the branch electrode 252c of the second main word line 252 and the branch electrode 256c of the fourth main word line 256 in the first section A1. The second keeper transistor is connected between the SWL16 and SWL24.

A gate electrode 260c of a third keeper transistor, through which a second sub word line selection signal bar signal FXB<1> is provided to the third keeper transistor, is disposed on the first VSS line 237a between the branch electrode 250c of the first main word line 250 and the branch electrode 254c of the third main word line 254 in the second section A2. The third keeper transistor is connected between the SWL2 and SWL10. A gate electrode 260d of a fourth keeper transistor, through which the second sub word line selection signal bar signal FXB<1> is provided to the fourth keeper transistor, is disposed on the second VSS line 237b between the branch electrode 252c of the second main word line 252 and the branch electrode 256c of the fourth main word line 256 in the second section A2. The fourth keeper transistor is connected between the SWL18 and SWL26.

Under the rule described above, a gate electrode of a keeper transistor connected between two SWLs is disposed between branch electrodes in each of the sections. Here, undescribed reference numeral BL denotes is a line for connecting gate electrodes of keeper transistor receiving the same signal.

Figure 10:
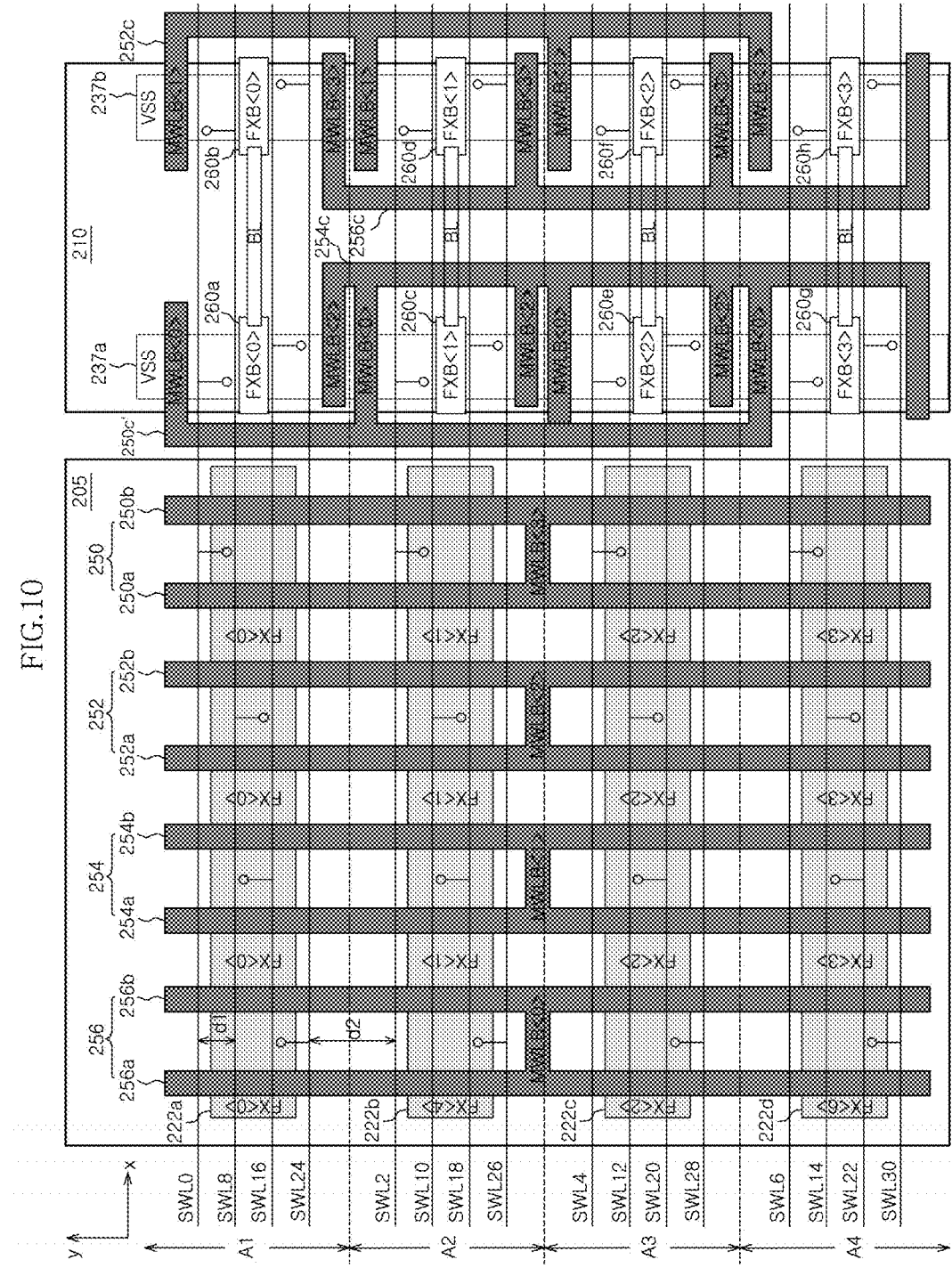

In this embodiment, the bar electrode 250b and the plurality of branch electrodes 250c in the first main word line 250 are integrally formed. However, as illustrated in FIG. 10, the bar electrode 250b and the plurality of branch electrodes 250c can be formed separately from each other.

According to this embodiment, the arrangement order of the SWLs is changed so that adjacent SWLs are controlled by different main word lines, respectively. Thus, the sub word line driver is designed so that adjacent SWLs share one keeper transistor with each other. Accordingly, the number of keeper transistors can be decreased by half or more, and the area of the sub word line driver can also be considerably decreased.

While certain embodiments have been described above, it will be understood to those skilled in the art that the embodiments described are by way of example only. Accordingly, the driver and device described herein should not be limited based on the described embodiments. Rather, the driver and device described herein should only be limited in light of the claims that follow when taken in conjunction with the above description and accompanying drawings.

What is claimed is:

1. A sub word line driver of a semiconductor integrated circuit device, comprising:
   a semiconductor substrate configured to comprise an N-well having PMOS transistors formed therein and a P-well having NMOS transistors formed therein;
   four sub word lines configured to be extended in parallel over the N-well and P-well;
   a sub word line selection line configured to be extended in a direction parallel with the four sub word lines;
   first and second VSS lines configured to be formed on the P-well, extended in a direction vertical to the extended direction of the sub word lines, and spaced apart from each other at a predetermined interval;
   a first main word line configured to comprise a pair of bar electrodes substantially intersecting with the four sub word lines and a branch electrode intersecting with the first VSS line;
   a second main word line configured to comprise a pair of bar electrodes substantially intersecting with the four sub word lines and a branch electrode intersecting with the second VSS line;
   a third main word line configured to comprise a pair of bar electrodes substantially intersecting with the four sub word lines and a branch electrode intersecting with the first VSS line; and
   a fourth main word line configured to comprise a pair of bar electrodes substantially intersecting with the four sub word lines and a branch electrode intersecting with the second VSS line,
   wherein the sub word line driver further comprises a first keeper transistor positioned between the branch electrodes of the first and third main word lines and a second keeper transistor positioned between the branch electrodes of the second and fourth main word lines.

2. The sub word line driver of claim 1, wherein an inverting signal of the sub word line selection line is inputted to gates of the first and second keeper transistors.

3. The sub word line driver of claim 1, wherein the first main word line is electrically related to the first sub word line, the second main word line is electrically related to the second sub word line, the third main word line is electrically related to the third sub word line, and the fourth main word line is electrically related to the fourth sub word line.

4. The sub word line driver of claim 1, wherein the branch electrodes of the first and second main word lines are disposed at an outside of the first sub word line, and the branch electrodes of the third and fourth main word lines are disposed at an outside of the fourth sub word line.

* * * * *